United States Patent
Miller et al.

(10) Patent No.: US 10,539,297 B2
(45) Date of Patent: Jan. 21, 2020

(54) QUANTUM DOT CONTAINING LIGHT MODULE

(75) Inventors: Gregory Miller, Sunnyvale, CA (US); William R. Freeman, Pittsburgh, PA (US)

(73) Assignee: CRYSTALPLEX CORPORATION, Pittsburgh, PA (US)

(*) Notice: Subject to any disclaimer, the term of this patent is extended or adjusted under 35 U.S.C. 154(b) by 0 days.

(21) Appl. No.: 14/128,253

(22) PCT Filed: Jun. 20, 2012

(86) PCT No.: PCT/US2012/043391
§ 371 (c)(1),
(2), (4) Date: Oct. 30, 2014

(87) PCT Pub. No.: WO2012/177793
PCT Pub. Date: Dec. 27, 2012

(65) Prior Publication Data
US 2015/0085490 A1    Mar. 26, 2015

Related U.S. Application Data

(60) Provisional application No. 61/499,075, filed on Jun. 20, 2011.

(51) Int. Cl.
*B82Y 20/00*        (2011.01)
*F21V 9/30*         (2018.01)
*F21V 13/08*        (2006.01)

(52) U.S. Cl.
CPC .............. *F21V 9/30* (2018.02); *F21V 13/08* (2013.01)

(58) Field of Classification Search
None
See application file for complete search history.

(56) References Cited

U.S. PATENT DOCUMENTS

| | | |
|---|---|---|
| 5,534,356 A | 7/1996 | Mahulikar et al. |
| 6,517,218 B2 | 2/2003 | Hochstein |
| 7,300,182 B2 | 11/2007 | Mazzochette |
| 7,390,108 B1 | 6/2008 | Wang |
| 7,789,661 B2 | 9/2010 | Ostler et al. |
| 7,911,797 B2 | 3/2011 | Grajcar |
| 8,240,882 B2 | 8/2012 | Liao et al. |
| 2004/0145312 A1 | 7/2004 | Ouderkirk et al. |
| 2004/0264195 A1 | 12/2004 | Chang et al. |
| 2006/0028882 A1 | 2/2006 | Qu |
| 2006/0054880 A1 | 3/2006 | Krishna et al. |

(Continued)

FOREIGN PATENT DOCUMENTS

| | | |
|---|---|---|
| EP | 2325897 A2 | 5/2011 |
| GB | 2366610 A | 3/2002 |

(Continued)

OTHER PUBLICATIONS

PCT/US2012/043391 International Search Report dated Sep. 7, 2012.

(Continued)

*Primary Examiner* — Andrew J Coughlin
(74) *Attorney, Agent, or Firm* — Pepper Hamilton, LLP

(57) ABSTRACT

Light modules for converting the wavelength of light are described herein along with methods for using and making such modules and devices incorporating such modules.

21 Claims, 6 Drawing Sheets

(56) References Cited

U.S. PATENT DOCUMENTS

| | | | |
|---|---|---|---|
| 2006/0113895 A1* | 6/2006 | Baroky | B82Y 10/00 313/501 |
| 2007/0087197 A1* | 4/2007 | Jang | B82Y 20/00 428/403 |
| 2007/0110816 A1* | 5/2007 | Jun | B82Y 30/00 424/490 |
| 2008/0173886 A1 | 7/2008 | Cheon et al. | |
| 2008/0175008 A1 | 7/2008 | Hu et al. | |
| 2008/0302977 A1* | 12/2008 | Yao et al. | 250/461.1 |
| 2009/0059554 A1* | 3/2009 | Skipor et al. | 362/29 |
| 2009/0127576 A1 | 5/2009 | Jang et al. | |
| 2010/0051898 A1 | 3/2010 | Kim et al. | |
| 2010/0139770 A1 | 6/2010 | Scher et al. | |
| 2010/0140551 A1 | 6/2010 | Parce et al. | |
| 2010/0171134 A1 | 7/2010 | Shao et al. | |
| 2010/0276638 A1 | 11/2010 | Liu et al. | |
| 2010/0283072 A1 | 11/2010 | Kazlas et al. | |
| 2010/0295070 A1 | 11/2010 | Su et al. | |
| 2011/0089809 A1* | 4/2011 | Noh | B82Y 20/00 313/483 |
| 2011/0198112 A1 | 8/2011 | Kim et al. | |
| 2014/0218943 A1 | 8/2014 | Freeman | |

FOREIGN PATENT DOCUMENTS

| | | |
|---|---|---|
| WO | 2005001889 A2 | 1/2005 |
| WO | 2011053635 A | 5/2011 |

OTHER PUBLICATIONS

European Patent Application No. 12801927 Supplementary European Search Report dated Sep. 19, 2014.

International Search Report for PCT/US14/014428 dated May 16, 2014.

* cited by examiner

QUANTUM DOT CONTAINING LIGHT MODULE

CROSS-REFERENCE TO RELATED APPLICATION

This application is a U.S. national stage filing under 35 U.S.C. § 371 of International Application No. PCT/US/2012/043391 filed Jun. 20, 2012 entitled "QUANTUM DOT CONTAINING LIGHT MODULE," which in turn claims the benefit of and priority to U.S. Provisional Patent Application No. 61/499,075 entitled "STABILIZED NANOCRYSTALS" which application was filed on Jun. 20, 2011. Each of the aforementioned applications is incorporated by reference herein in its entirety and for all purposes.

BACKGROUND

While researches in biological fields are looking to quantum dots to replace organic fluorescent dyes, quantum dots also hold promise for use in electronic devices. Research is ongoing into incorporating quantum dots into photovoltaics, solid-state lighting (mainly as quantum dot phosphors), electroluminescent displays, and quantum computing devices. Semiconductor light emitting diode (LED) devices have been made since the early 1960s and currently are manufactured for usage in a wide range of consumer and commercial applications. The layers including the LEDs are based on crystalline semiconductor materials that require ultra-high vacuum techniques for their growth, such as, metal organic chemical vapor deposition. In addition, the layers typically need to be grown on nearly lattice-matched substrates in order to form defect-free layers. These crystalline-based inorganic LEDs have the advantages of high brightness (due to layers with high conductivities), long lifetimes, good environmental stability, and good external quantum efficiencies. The usage of crystalline semiconductor layers that results in all of these advantages, also leads to a number of disadvantages including high manufacturing costs, difficulty in combining multi-color output from the same chip, and the need for high cost and rigid substrates.

Since the mid 1980s, LED displays have been brought out into the marketplace and there has been great improvements in device lifetime, efficiency, and brightness. For example, devices containing phosphorescent emitters have external quantum efficiencies as high as 19%; whereas, device lifetimes are routinely reported at many tens of thousands of hours. In comparison to crystalline-based inorganic LEDs, OLEDs have much reduced brightness (mainly due to small carrier mobilities), shorter lifetimes, and require expensive encapsulation for device operation. On the other hand, OLEDs enjoy the benefits of potentially lower manufacturing cost, the ability to emit multi-colors from the same device, and the promise of flexible displays if the encapsulation issues can be resolved.

To improve the performance of OLEDs, quantum dots were introduced in to the emitter layers to enhance the color gamut of the device and reduce manufacturing costs. Because of problems, such as, aggregation of the quantum dots in the emitter layer, the efficiency of these devices was rather low in comparison with typical OLED devices. The efficiency was even poorer when a neat film of quantum dots was used as the emitter layer. Regardless of any future improvements in efficiency, these hybrid devices still suffer from all of the drawbacks associated with pure OLED devices.

Recently, all-inorganic LEDs have been constructed by, for example, sandwiching a monolayer thick core/shell CdSe/ZnS quantum dot layer between vacuum deposited n- and p-GaN layers. However, such devices exhibit poor external quantum efficiency of 0.001 to 0.01% because of organic ligands of trioctylphosphine oxide (TOPO) and trioctylphosphine (TOP) insulators that result in poor electron and hole injection into the quantum dots. In addition, the structure is costly to manufacture, due to electron and hole semiconducting layers grown by high vacuum techniques, and sapphire substrates. Accordingly, it would be highly beneficial to construct an all inorganic LED based on quantum dot emitters which was formed by low cost deposition techniques and whose individual layers showed good conductivity performance. The resulting LED would combine many of the desired attributes of crystalline LEDs with organic LEDs.

SUMMARY

Embodiments include a light module including a first substrate, a conversion layer adjacent to the first substrate and contacting the first substrate, the conversion layer comprising at least one quantum dot/nanocrystal and a matrix material, and a second substrate adjacent to the conversion layer and contacting the conversion layer on a surface opposite the surface contacting the first substrate. In some embodiments, the light matrix material may include a polymer matrix in which the at least one quantum dot/nanocrystal is embedded an in other embodiments, the conversion layer may include at least one scattering particle. In various embodiments, at least one of the conversion layer, first substrate layer, or second substrate layer may be textured, patterned, coated, chemically modified, or combinations thereof.

The light module may further include an intermediate layer having a diffusing layer positioned and arranged to increase the path length of light entering the conversion layer, and in some embodiments, the diffusion layer comprises a photonic crystal film. In other embodiments, the diffusion layer may be patterned, and in particular embodiments, the diffusion layer may have a hexagonal waffle pattern.

In still further embodiments, the light module may include one or more reflective layers positioned and arranged to reflect light of a wavelength corresponding to the wavelength emitted by the conversion layer away from a light source. In various embodiments, the light module may include a light source, and in particular embodiments, the light source produces blue light.

In particular embodiments, the quantum dots/nanocrystals may include an inorganic coating. In some embodiments, the conversion layer may include a plurality of quantum dots/nanocrystals dispersed throughout the matrix material. In some embodiments, the plurality of quantum dots/nanocrystals may include two or more species of quantum dots/nanocrystals capable of emitting light at different wavelengths, and in other embodiments, the two or more species of quantum dots/nanocrystals are arranged randomly. In some embodiments, the two or more species of quantum dots/nanocrystals may be arranged in groups of quantum dots/nanocrystals emitting light of the same wavelength, and in still other embodiments, the groups of quantum dots/nanocrystals may be arranged in geometric patterns selected from rows, blocks, squares, circles, ovals, or combinations thereof.

Various other embodiments are directed to an optoelectric device including a light source capable of producing light having an input wavelength, a light module including a first substrate, a conversion layer adjacent to the first substrate and contacting the first substrate, the conversion layer comprising plurality of quantum dots/nanocrystals dispersed within a matrix material and being capable of converting the input wavelength to one or more different wavelengths of outgoing light, and a second substrate adjacent to the conversion layer and contacting the conversion layer on a surface opposite the surface contacting the first substrate a conversion layer.

In some embodiments, the light source may be selected from an light emitting diode (LED), incandescent bulb, fluorescent bulb, laser, electroluminscent, or combination thereof, and in particular embodiments, the light source may be a solid state light source. In some embodiments, the plurality of quantum dots/nanocrystals may include two or more species of quantum dots/nanocrystals capable of emitting light at different wavelengths. In certain embodiments, the optoelectrical device may include a second light module having a conversion layer comprising plurality of quantum dots/nanocrystals dispersed within a matrix material and being capable of converting the input wavelength to a wavelength of outgoing light other than the one or more wavelengths of outgoing light converted by the light module. In further embodiments, the light module may convert input light to red output light and the second light module may convert input light to green output light.

Particular embodiments are directed to a light module including a first substrate, a conversion layer adjacent to the first substrate and contacting the first substrate, the conversion layer including a plurality of quantum dots/nanocrystals dispersed throughout the matrix material, and a second substrate adjacent to the conversion layer and contacting the conversion layer on a surface opposite the surface contacting the first substrate.

In such embodiments, the plurality of quantum dots/nanocrystals comprises two or more species of quantum dots/nanocrystals capable of emitting light at different wavelengths. The two or more species of quantum dots/nanocrystals can be arranged randomly, or the two or more species of quantum dots/nanocrystals can be arranged in groups of quantum dots/nanocrystals emitting light of the same wavelength. In certain embodiments, the groups of quantum dots/nanocrystals can arranged in geometric patterns selected from rows, blocks, squares, circles, ovals, or combinations thereof, and in some embodiments, the quantum dots may be arranged in rows grouped by emission color. Thus, for example, individual rows of red emitting quantum dots, may be positioned adjacent to individual rows of green emitting quantum dots, and in some embodiments, these red and green rows may be positioned adjacent to blue emitting quantum dots.

DESCRIPTION OF DRAWINGS

In the following detailed description, reference is made to the accompanying drawings, which form a part hereof. In the drawings, similar symbols typically identify similar components unless context dictates otherwise. The illustrative embodiments described in the detailed description, drawings, and claims are not meant to be limiting. Other embodiments may be utilized and other changes may be made, without departing from the spirit or scope of the subject matter presented herein. It will be readily understood that the aspects of the present disclosure, as generally described herein and illustrated in the Figures, can be arranged, substituted, combined, separated, and designed in a wide variety of different configurations, all of which are explicitly contemplated herein

DETAILED DESCRIPTION

Figure 1:
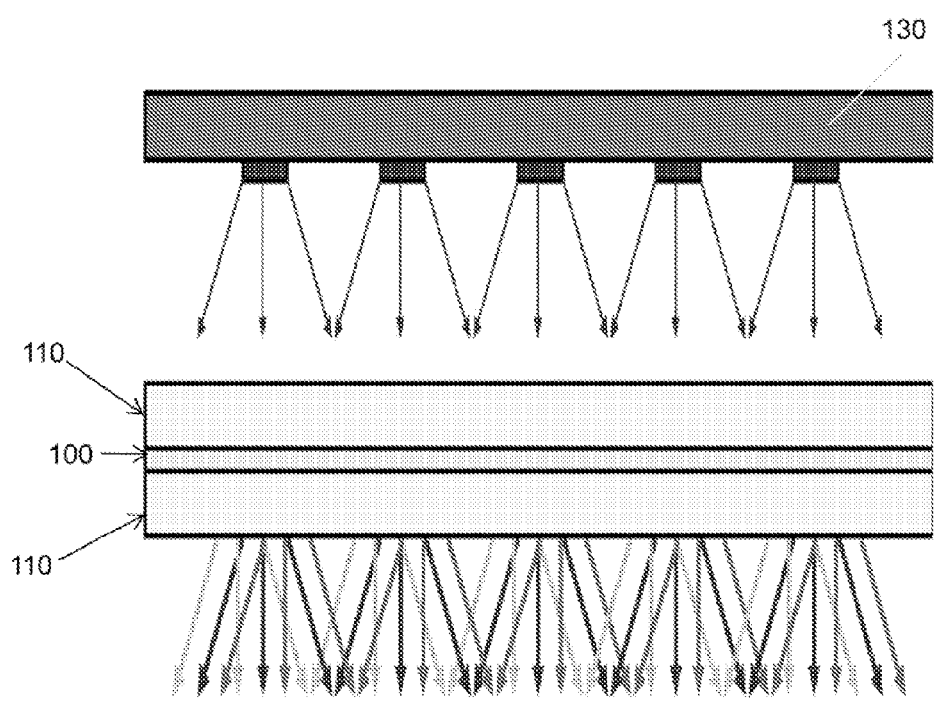
FIG. 1 is a schematic drawing of a quantum dot based light module

Embodiments disclosed herein may be understood more readily by reference to the following detailed description and Examples. It is to be understood that the terminology used is for the purpose of describing specific embodiments only and is not intended to be limiting.

Unless defined otherwise, all technical and scientific terms have the same meaning as is commonly understood by one of ordinary skill in the art to which the embodiments disclosed belongs.

As used herein, "a" or "an" means "at least one" or "one or more."

As used herein, "about" means that the numerical value is approximate and small variations would not significantly affect the practice of the disclosed embodiments. Where a numerical limitation is used, unless indicated otherwise by the context, "about" means the numerical value can vary by ±10% and remain within the scope of the disclosed embodiments.

The terms "attached" or "operably bound" as used herein interchangeably to refer to formation of a covalent bond or a non-covalent association between a combination of two or more molecules, of sufficient stability for the purposes of use in detection systems as described herein and standard conditions associated therewith as known in the art. The attachment may comprise, but is not limited to, one or more of a covalent bond, an ionic bond, a hydrogen bond, or a van der Waals interaction.

A "core nanocrystal" is understood to mean a nanocrystal to which no shell has been applied; typically it is a semiconductor nanocrystal. A core nanocrystal can have a homogenous composition or its composition can vary with depth inside the nanocrystal. Many types of nanocrystals are known, and methods for making a core nanocrystal and applying a shell to a core nanocrystal are known in the art. The shell-forming methods described herein are applicable for producing a shell on core nanocrystals. To distinguish a nanocrystal used in disclosed embodiments from one that might be formed unintentionally in a shell-forming step, the nanocrystal introduced into a reaction mixture is referred to as a primary nanocrystal, regardless of whether it is a core nanocrystal or a core/shell nanocrystal. In either event, the methods disclosed herein produce a new shell on the outer surface of the primary nanocrystal.

As used in the claims and specification, the words "comprising" (and any form of comprising, such as "comprise" and "comprises" and "comprised"), "having" (and any form of having, such as "have" and "has"), "including" (and any form of including, such as "includes" and "include"), or "containing" (and any form of containing, such as "contains" and "contain"), are inclusive or open-ended and do not exclude additional, unrecited elements or method steps.

"Monodisperse" as used herein refers to a population of particles (e.g., a colloidal system) wherein the particles have substantially identical size and shape. For the purpose of the present invention, a "monodisperse" population of particles means that at least about 60% of the particles, preferably about 75% to about 90% of the particles, fall within a specified particle size range.

"Optional" or "optionally" may be taken to mean that the subsequently described structure, event or circumstance may or may not occur, and that the description includes instances where the event occurs and instances where it does not.

"Surface layer" as used herein refers to a layer of small-molecule ligands coordinated to the nanocrystal's outer surface, which may be further cross-linked or modified. The surface layer may have other or additional surface coatings that modify the solubility properties of the particle, which are sometimes referred to herein as "coating layers," "capping layers," or "coatings."

"Semiconductor" as used herein means any material that exhibits a finite band gap energy in the range of about 0.01 eV to about 10 eV.

"Nanocrystal" as used herein can refer to a particle made out of an inorganic substance that typically has an ordered crystalline structure having at least one major dimension in the nanosize range, for example, at least one major dimension measuring from 1 to 1000 nanometers. The term "nanocrystal" can refer to a "core nanocrystal" consisting of crystalline particle, or a "core/shell nanocrystal," which describes a nanocrystal having a nanocrystal core of a first material and a shell layer of a second material surrounding the core. In general, a nanocrystal including both core and core/shell nanocrystal can have a diameter of from about 1 to about 1000 nm, about 1 nm to about 100 nm, or about 1 nm to 50 nm.

The nanocrystals, such as those used in the embodiments described herein, can be bright fluorescent nanocrystals and quantum dots prepared from such bright fluorescent nanocrystals can also be bright. For example, a typical quantum yield for a nanocrystal can be at least about 10%, at least 20%, at least 30%, at least 40%, and at least 50% or greater than 50%. In some embodiments, nanocrystals can have a surface layer of ligands to protect them from degradation during use or while in storage; thus isolated nanocrystals made by the methods of embodiments can have a surface layer of ligands on the outside of the shell of the nanocrystal.

"Nanoparticle" as used herein refers to any nanocrystal, such as a core nanocrystal or core/shell nanocrystal, having any associated organic coating or other material on the surface of the nanocrystal that is not removed from the surface by ordinary solvation. The organic coating or other material can further be cross-linked, can have other or additional surface coatings that can modify the properties of the particle, for example, increasing or decreasing solubility in water or other solvents. Nanocrystals having such cross-linked or modified coatings on their surfaces are encompassed by the term 'nanoparticle.'

"Quantum dot" as used herein typically refers to a nanocrystalline particle made from a material that in the bulk is a semiconductor or insulating material, which has a tunable photophysical property in the near ultraviolet (UV) to far infrared (IR) range, and in particular, the visible range.

"Wavelength" as used herein refers to the emission band or peak wavelength emitted, absorbed, reflected, and so forth.

Embodiments are directed to light emitting diodes (LEDs) and light modules that include nanocrystals and quantum dots such as those described below. The LEDs and light modules of such embodiments can be incorporated into various optoelectrical devices including, for example, displays and solid state light sources. The displays of various embodiments can be any type of display known in the art such as, but not limited to, backlight displays, multi-color displays, full color displays, monochrome displays, pixilated displays, and so on, and the solid state light sources of embodiments, are not limited and can be any type of lighting device.

The light modules of various embodiments are generally layered. For example, the light module 10 presented in FIG. 1 is includes at least one conversion layer 100. The conversion layer may generally include at least one nanocrystal or quantum dot, and in particular embodiments, the conversion layer may include an array of nanocrystals or quantum dots.

In some embodiments, the nanocrystals or quantum dots may be directly attached to a substrate. For example quantum dots with pyridine ligands may adhere directly to a substrate and the pyridine can be driven off to provide a conversion layer on a substrate.

In other embodiments, the conversion layer may include a matrix material combined with the at least one nanocrystal or quantum dot or array of nanocrystals or quantum dots and to provide a material having the nanocrystals or quantum dots embedded in the binder or support material. The matrix material may be any material known in the art, and in particular embodiments, the matrix material may be optically transparent or sufficiently transparent to not interfere with the emission of the quantum dots or nanocrystals during use of the device. In some embodiments, the matrix material may be a polymeric material, and in particular embodiments, the polymeric material may be curable using ultraviolet light or heat. Non-limiting examples of such polymeric materials include epoxies, silicones, sol-gels, acrylic based, or any other cross linkable system where the linking conditions are not detrimental to the QDs.

The nanocrystals or quantum dots of various embodiments may be active in a single wavelength range, meaning light is absorbed at a first wavelength and emitted at a single second wavelength. In other embodiments, the nanoparticles or quantum dots may be an array of nanoparticles or quantum dots that absorb light of a first wavelength and emit light of various second wavelengths. For example, in some embodiments, the an array of nanoparticles or quantum dots may include a quantity of nanoparticles or quantum dots that adsorb light in the blue spectrum and emit light in the red spectrum, a quantity of nanoparticles or quantum dots that adsorb light in the blue spectrum and emit light in the green spectrum, and a quantity of nanoparticles or quantum dots that adsorb light in the blue spectrum and emit light in the blue spectrum. Such an array of nanoparticles or quantum dots may be provided in a random distribution in which the nanoparticles of various activities are combined and distributed within the conversion layer as an unpatterned array, or in certain embodiments, the array of nanocrystals or quantum dots may be patterned. In embodiments in which the array is patterned, any pattern known in the art may be used. For example, in some embodiments, a stripe of nanocrystals having the a first activity (i.e., emitting at the same wavelength) may be positioned on a substrate next to a stripe or nanocrystals having a second activity, and so on to provide a striped pattern. In other embodiments, nanocrystals having different activities may be provided in different geometrically shaped zones such as, for example, squares, rectangles, circles, ovals, waves, lines, and so forth, that can be adjacent to one another or interconnected such that portions of a zone of nanocrystals having a first activity can overlap portions of zones having a second and/or third activity. In embodiments in which the quantum dots are arranged in a pattern, the composite output spectrum of the conversion layer may be determined primarily by the dimensions of the various substructures and the concentrations of the QDs in those structures.

In some embodiments, light modules, such as those presented in FIG. 1, may further include one or more substrate layers 110. Generally, the substrate layer may be composed of any clear or translucent material including, for example, glass, or a clear polymer, and the substrate layer may be flexible, semi-rigid, rigid, or a combination thereof. While FIG. 1 shows a light module having two substrate layers 110 disposed on either side of a conversion layer 100, in some embodiments, a conversion layer may be disposed on a single substrate layer, or the conversion layer may be disposed between a substrate layer and a second none substrate layer such as, for example, a light source.

Figure 2:
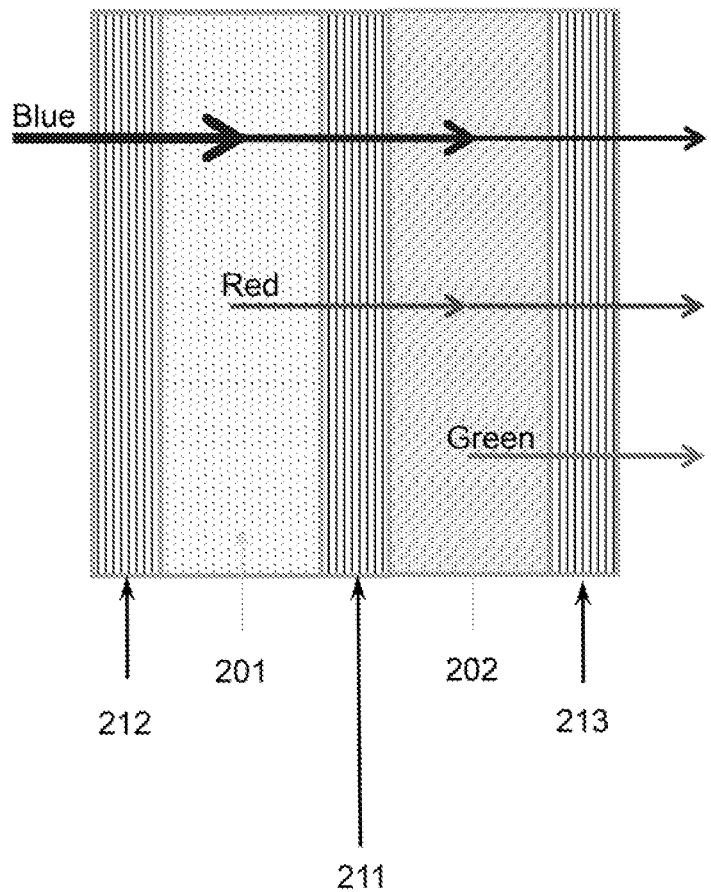
FIG. 2 is a schematic drawing of a quantum dot based light module having two independent conversion layers.

In still further embodiments, a substrate layer may be disposed between two or more conversion layers, and in particular embodiments, multiple alternating substrate and conversions layers may be combined into a single module. FIG. 2 provides an illustrative embodiment of a module 20 including two conversion layers of nanocrystals each having different activities. In particular, a first conversion layer of red emitting nanocrystals 201 may be adjacent to a second conversion layer of green emitting nanocyrstals 202. Between the first conversion layer and the second conversion layer may be at least one substrate layer 211, and this substrate layer can be treated or include coatings or associated intermediate layers as discussed below. Additional substrate layer 212, 213, can be positioned on opposing ends of the module contacting the first and second conversion layers, respectively. When placed under a blue input light source where incoming light can pass through the conversion layers unmodified, a module such a module 20 can be used to produce a red, green, blue spectrum of light commonly used in color displays. In still further embodiments, each of the conversion layers may be patterned, as discussed above, to further enhance the output of the module.

Returning to FIG. 1, the light module 10 of some embodiments, may further include a light source 130 positioned and arranged to irradiate the conversion layer 100. The light source 130 may be any light source known in the art including light emitting diodes (LED), incandescent bulbs, fluorescent bulbs, lasers, electroluminiscents, or combination thereof and may provide light of any wavelength or spectral source. For example, in various embodiments, the light source 130 may provide white light, green light, yellow light, orange light, red light, blue light, violet light, ultraviolet light, or any combination thereof. The light source may be a single light source or may be the combination of more than one light source. In particular exemplary embodiments, light source 130 may provide blue light, i.e., light having any wavelength shorter than 500 nm.

Figure 3:
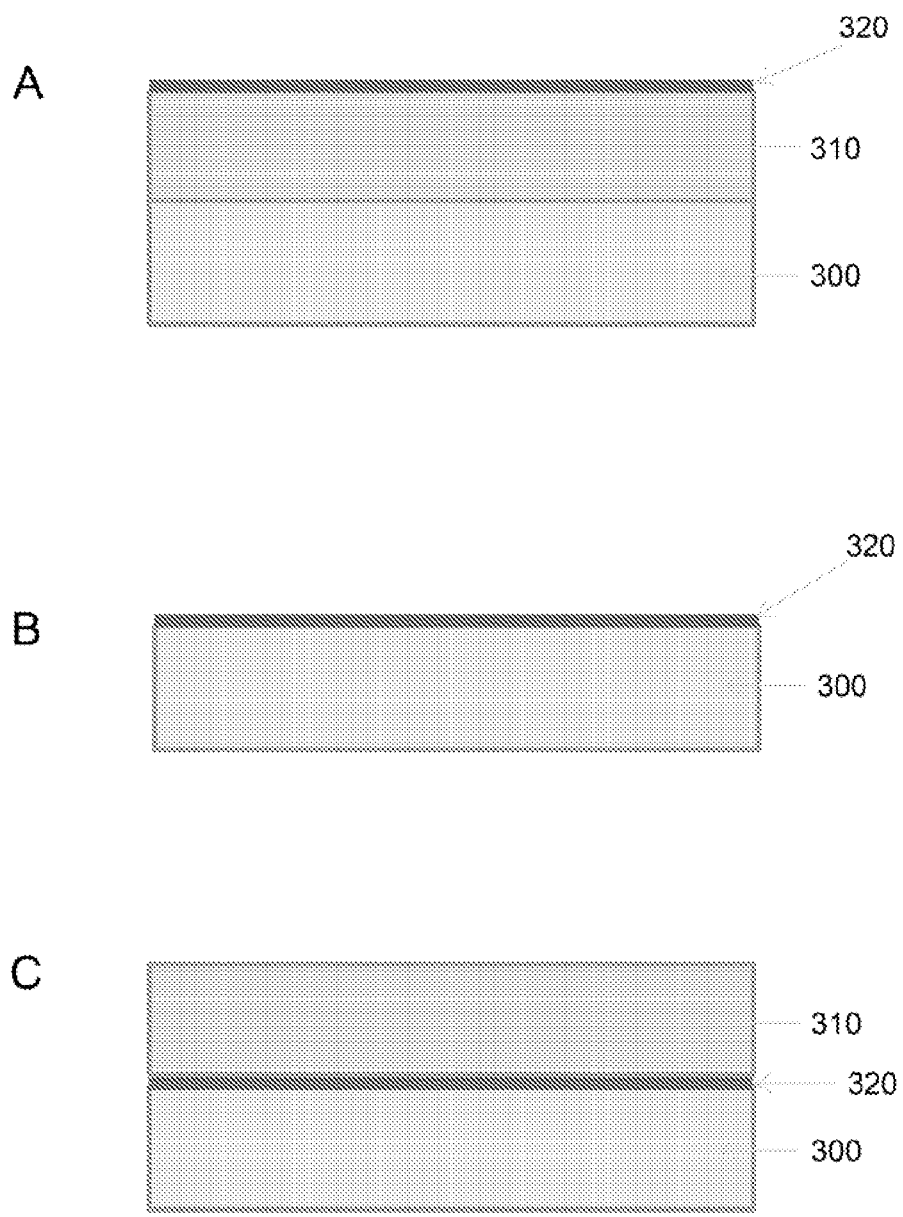
FIG. 3 is a schematic drawing of light modules with various arrangements of intermediate layers.

In some embodiments, the conversion layer, substrate layer, or combinations thereof may be textured, patterned, coated, chemically modified, or otherwise treated to facilitate binding of the conversion layer to the substrate, and in particular embodiments, the substrate layer may be treated as described above to interact with incoming or outgoing light. As illustrated in FIG. 3, in various embodiments, the treated portion 320 of the substrate 310 may be opposite the conversion layer 300 (FIG. 3A). In other embodiments, the treated portion 320 of the substrate 310 may be provided on surface of the substrate 310 directly contacting the conversion layer 300 (FIG. 3C), or the conversion layer 300 itself may be treated by providing a texture, pattern, coating, or chemical modification 320. In such embodiments, a treatment may cause an alteration of the underlying substrate or conversion layer to a particular depth within the substrate or conversion layer. In other embodiments, the treatment may produce an additional layer that on or between the underlying substrate or conversion layer. For example, FIG. 3C shows a treatment layer 320 as an additional between the substrate 310 and conversion layer 300. This treatment layer 320 can be integral to either the substrate 310 or the conversion layer 200, or the treatment layer 320 may be an intermediate layer between substrate 310 and the conversion layer 300.

Figure 4:
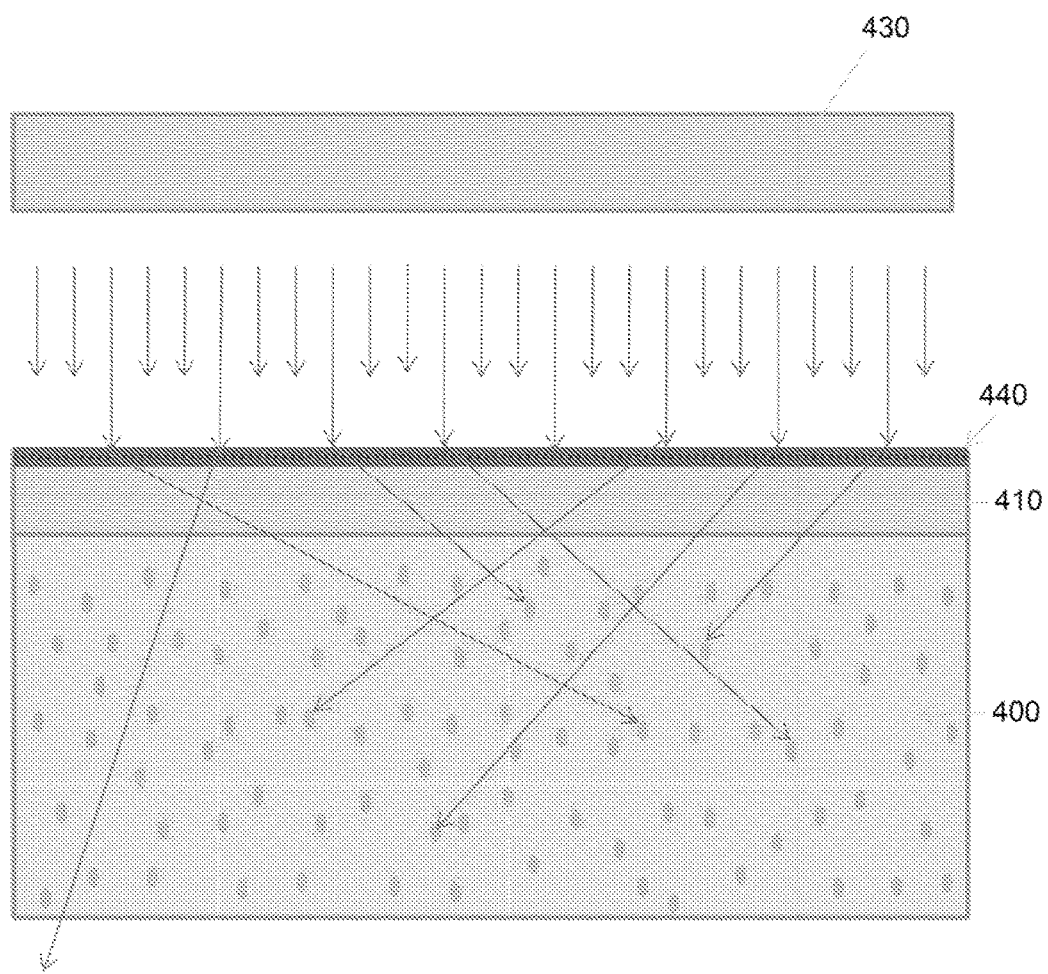
FIG. 4 is a schematic drawing of a light module having a diffusion layer.
Figure 5:
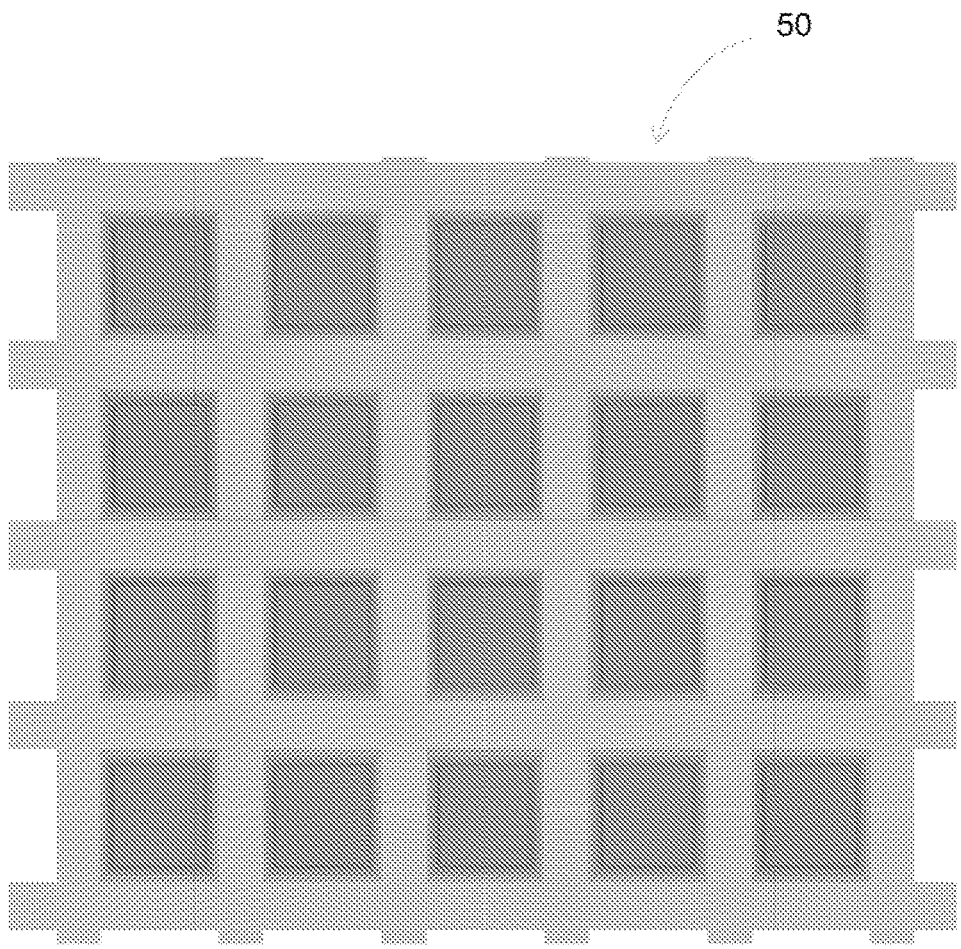
FIG. 5 is a magnified drawing of a patterned diffusion layer.

In some embodiments, the light module can further include the one or more devices for collimating light such as, for example, reflector cups, or a color filter. the collimating device or color filter may be positioned to contact light before the light enters the conversion layer 400 and can be associated with either the conversion layer 400, substrate 410, light source 430, or any intermediate or treatment layer (not pictured). In particular embodiments as illustrated in FIG. 4, the light module may include a diffusing layer 440 such as, for example, a photonic crystal film, positioned between the substrate layer 410 and the light source 430 that may allow the conversion layer 400 to more efficiently increase the path length of the entering light widening the viewing angle of the output light by giving it a more Lambertian distribution. Such a diffusion layer 440 may be planar or the diffusion layer may have a pattern. For example, in certain embodiments, a photonic crystal film diffusion layer 440 may have a hexagonal waffle pattern 50 as illustrated in FIG. 5 that is used to suppress zero order transmission while allowing second and third order transmissions.

In some embodiments, diffusion may be further improved by adding a scattering agent to the conversion layer. The scattering agent may be any material that has low absorption at the wavelengths of interest and a refractive index that differs significantly from the surrounding matrix. A scattering agent may also allow back scattered light to be redirected and exit the conversion layer in the intended direction or be converted by the conversion layer. These scattering agents may be any material that has low absorption at the wavelengths of interest and differs significantly in refractive index from the surrounding matrix. Examples of scattering agents in matrix materials that are suitable for use in the conversion layers of embodiments include poly(methyl methacrylate) (PMMA) in silicone, alumina in silicone, silica in silicone, and the like and combinations of these.

Diffusion of the light entering the light module can be further modified in a number of ways to achieve various point spread functions (PSF), and in some embodiments, the PSF may be modified in a wavelength dependent, which without wishing to be bound by theory, may allow picture processing algorithm need to consider only one color or the white light combination of colors simplifying image processing software. The appearance of the display at a particular point or pixel is the superposition of all sources contributing to that pixel. As the light progresses through the conversion layer at an angle the blue input light is progressively converted to green and red by the quantum dots in the conversion layer. Because the path length through the film at an angle is greater than the perpendicular length by a factor of $1/\cos(u)$, where u is the angle of the ray to the normal, as blue light moves away from the light source the spectral composition of light coming from the conversion layer will be progressively depleted in blue while becoming progressively more yellow.

Additionally, changing the thickness of the film does not change the number of quantum dots that a ray of blue light passes if the total number of quantum dots is the same in each film. Changing the film thickness only changes the number of quantum dots per unit volume or concentration, and changing the film thickness will not have much effect on the appearance of the film, since the inverse cosine relationship of the path length ratios will still hold. However, quantum dots become highly scattering in the excited state possibly due to the formation of a large dipole moment. The thinner the film, the easier it is for a scattered blue photon to escape before being absorbed by a green or red quantum dot and the same is true of a scattered green photon escaping before being absorbed by a red quantum dot. However, quantum dots in an excited state create a PSF for the blue light that matches the quantum dot PSF. Thus, in some embodiments, a thin conversion layer may provide sufficient diffusing can be achieved without incorporating a diffusing agent into light module to enhance the scattering of the blue LED light.

In still further embodiments, the light module may include an reflective layer to redirect backscattered light in the preferred direction. For example, an antireflective coating may be provided on or within the module to improve the exiting of light from the module. In certain embodiments, an reflective may be provided between the conversion layer and substrate layer, and in embodiments, in which the light module includes multiple conversion layers, additional reflective layers may be added between various conversion layers to prevent the reabsorption of converted light.

In operation, the conversion layer of various embodiments may be configured to convert incoming light of a first wavelength into outgoing light of a second wavelength. For example, in some embodiments, the incoming light may be converted from a shorter wavelength to outgoing light of a longer wavelength. Light conversion is not limited to single wavelengths, but may include a distribution of wavelengths of the incoming and outgoing light. Thus, various embodiments are directed to methods for converting modifying the wavelength of light by contacting a conversion layer as described with light. In various embodiments, light from the light source 130 is used to irradiate the conversion layer, and nanocrystals or quantum dots embedded in the conversion layer absorb the light from the light source and emit light at a different wavelength. For example, in some embodiments the light source may provide blue light of a single wavelength distribution. The conversion layer may include nanocrystals that absorb blue light and emit light of various different wavelengths to produce light having multiple colors. Thus, a single wavelength source can provide an spectral array of colors. In particular embodiments, incoming blue light of a single wavelength distribution can be converted to multiple wavelength distributions of green and red light, and such a light module can be used to produce a color display. In still other embodiments, near infrared (NIR) light sources may be converted to mid-infrared (MIR) for through air transmission, which can be useful for personnel and vehicle identification.

Certain embodiments are directed to modules that are arranged to reduce readsorption. Reabsorption refers to a process whereby light emitted by a nanocrystal or quantum dot is absorbed by other nanocrystal or quantum dot inside the conversion layer, which leads to a reduction in overall efficiency. The reabsorbed light is then either emitted by the second nanocrystal or quantum dot or converted to heat. Reabsorption occurs in many conventional fluorescent materials as well as in quantum dots. The fraction of photons absorbed by a quantum dot that are then emitted at longer wavelengths is governed by the quantum dot's quantum efficiency. For example, a quantum efficiency of 85% means that 85% of the absorbed photons are converted to the emission spectrum for that quantum dot and 15% of the absorbed photons are converted to heat. Overall optical efficiency is the product of the quantum efficiency and the ratio of the absorbed wavelength over the emitted wavelength.

Quantum dots do not absorb wavelengths longer than their emission wavelength, and the strength of absorption of wavelengths equal to shorter than the QD emission wavelength increases as the difference between the excitation and emission wavelengths increases. The arrangement of nanocrystals emitting different wavelengths of light may reduce or minimize reabsorption of the light by excluding short wavelength emitted light regions producing long wavelength emitted light. Therefore, in some embodiments, multiple conversion layers containing light modules can be arranged from longest wavelength to shortest wavelength so that as light passes from the backplane near the light source through the light module with minimal reabsorption. For example, in the module 20 of FIG. 2, blue light absorbed by a green quantum dot in the second conversion layer 202 produces green light, a portion of which is absorbed by a red quantum dots in the first conversion layer 201, which in turn produces red light. By placing the second conversion layer 202 that emits shorter wavelength green light downstream of the first conversion layer 201 that emits longer wavelength red light, the amount of reabsorption can be limited. In addition, providing a reflective layer on or within the middle substrate layer that reflects green light while allowing red and blue light to pass can further reduce reabsorption.

In some embodiments, light modules having the layered structure described above may be incorporated into a liquid crystal display (LCD). Because input light for LCD must be polarized, roughly half of the light leaving the light module is reflected upon entering the LCD. This implies that a significant portion of the light is making multiple passes through the cavity between the light module and the LCD. Reducing the probability of light having wavelengths shorter than the emission wavelength of quantum dots in the conversion layer, other than that portion of the blue that is to be converted, should improve the overall efficiency of the light module. Thus, in some embodiments, a coating capable of reflecting light reflected from the LCD back away from the light module may be provided on the light module. This prevents green light reflected from the LCD from passing though the red QD layer and the red from striking the light source. In other embodiments, multiple coatings may be provided that block light having longer wavelengths from entering a particular conversion layer may be interspersed between conversion layers in a multi-conversion layer device. For example, in FIG. 2, a first reflective layer may be provided between the red conversion layer and the light source preventing red light from striking the backplane and possibly being absorbed by the light source. A second reflective layer may be positioned between the first conversion layer 201 and the second conversion layer 202 to prevent the green light from hitting the red conversion layer and the light source. Such an arrangement eliminates two sources of absorption.

The reflective layers described above may further be coupled with antireflective layers. For example, in the device of FIG. 2, a blue antireflective layer may be positioned between the first conversion layer 201 and the light source that facilitates introduction of blue light into the first conversion layer 201. Additional anti-reflective layers can be provided between the first conversion layer 201 and the second conversion layer 202 that facilitate the introduction of both blue and red light into the second conversion layer 202. In still further embodiments, a boardband antireflective layer may be provided between the second conversion layer and the LCD.

The reflective and antireflective layers described above may be incorporated into the light modules of various embodiments as a separate layer that is sandwiched between the conversion layers, or in other embodiments, the reflective and antireflective layers may be applied as coatings onto a substrate or conversion layer during preparation of the light module. In still other embodiments, the various reflective and antireflective layers may be combined to form a substrate that is incorporated into the light module. Reflective and antireflective coatings are well known in the art and any such coatings can be used in embodiments of the invention.

Reabsorption can also occur among nanocrystals the emit at the same wavelength. For example, red light can be absorbed by a red quantum dot and then emitted as a longer wavelength of red light causing a red shift of the overall spectrum. Substrates that include texturing or other treatments that direct blue light to travel nearly in the plane of the conversion layer may decrease reabsorption by increasing the optical path length of the blue light, which in turn increases the ratio of blue to red absorption. Alternatively, injection of blue light into one or more edge of the conversion layer can achieve a similar effect; however, it is very difficult to achieve uniform emission spectra with edge coupling.

In still further embodiments, the concentration of nanocrystals can be reduced by providing a photonic coupling structure that introduces light into the conversion layer at large angles. The increased optical path length for the light can be leveraged to reduce the concentration of the quantum dots in the conversion layer. For example, introducing blue light into a conversion layer at, for example, a 45° angle by passing the light through a diffusion layer directly or indirectly coupled to the conversion layer can be used to reduce the quantum dot concentration by up to about 30%.

Figure 6:
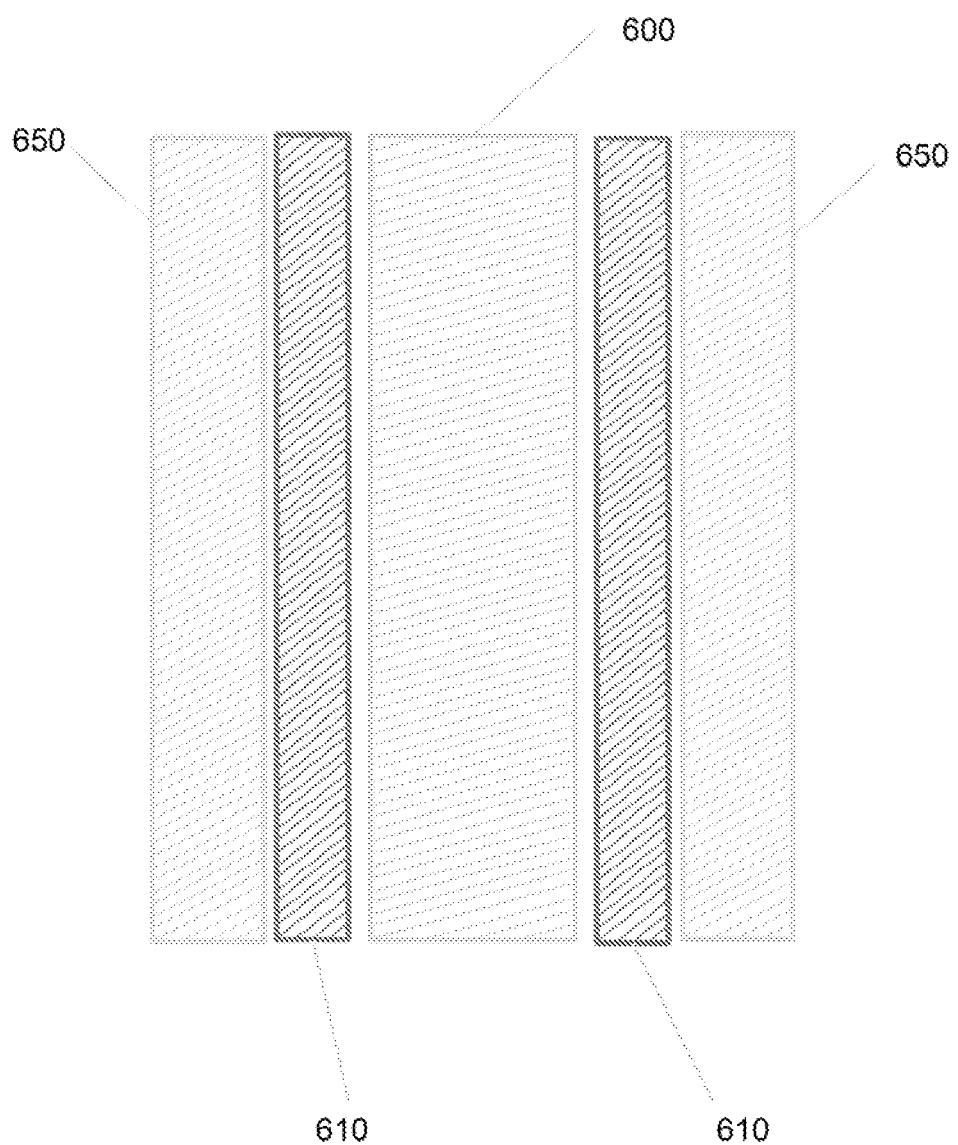
FIG. 6 is a schematic drawing of a device for making a light module.

Further embodiments are directed to methods for preparing the light modules described above. Such methods, generally, include the steps of filling a gap between two substrate layers or a between a substrate layer and a second none substrate layer with a liquid that includes a matrix material and nanocrystals or quantum dots and curing the liquid to create a conversion layer. In some embodiments, such methods may include the steps of providing a two parallel substrates with a gap between the parallel substrates. In particular embodiments two or more edges of the parallel substrates can be sealed, and in some embodiments, three edges can be sealed. In certain embodiments, a jig or chuck may be used to properly position the parallel substrates. For examples, as illustrated in FIG. 6, a vacuum chuck 550 having parallel walls may be used to position the parallel substrates 510. The liquid matrix material and nanocrystals can then be introduced into the gap formed between the parallel substrates to produce the conversion layer 500. Such vacuum chucks can hold the substrate 510 rigidly against the chuck wall 550 while the conversion matrix is added and holding the spacing between the substrates at a fixed distance during the curing process. The space between the substrate sheets can be sealed on three sides so that filling occurs by gravity and capillary action. In some embodiments, curing can be carried out at a temperature below the melting point of the substrate or the wall of the curing chamber in the case of free standing films. In such embodiments, no significant amount of gas is created or trapped within the matrix during the cure process.

In other embodiments, the nanocrystals can be applied to the substrate by a printing process, and in some embodiments, printing may allow for the creation of patterned conversion layers.

The conversion layers described above may be prepared from any nanocrystal or quantum dot known in the art, and such conversion layers can be incorporated into light modules that include any of the features described above. In particular embodiments, the nanocrystals and quantum dots used in the conversion layers described above may have an inorganic coating. In such embodiments, the nanocrystals and quantum dots may include a semiconductor nanocrystal defining an outermost surface and an inorganic coating covering the outermost surface of the nanocrystal.

Nanocrystals and quantum dots heretofore described must include organic components such as, organic ligands, that bind to an outermost surface of the nanocrystal. These organic ligands passivate the nanocrystal and provide an environment in which the nanocrystal can fluoresce. Removing the organic layer renders the nanocrystal or quantum dot unable to fluoresce, and therefore, unsatisfactory for its intended purpose.

In various embodiments, the nanoparticles may include an inorganic coating that includes less than about 30% organic components, less than 20%, less than 10%, less than 5%, or less than 1% organic components, and in certain embodiments, the inorganic coating may include substantially no organic components, which may encompass 0% or very near 0% organic components. The inorganic coating of such embodiments may bind directly to the outermost surface of the nanocrystal, and in particular embodiments, the inorganic coating may provide a passivation layer or the outermost surface of the nanocrystal.

While not wishing to be bound by theory, nanocrystals and quantum dots having an inorganic coating may provide sufficient fluorescence for any purpose currently practiced using the organic ligand coated nanoparticles, but not limited to, biological applications as, for example, signaling molecules. In addition, nanocrystals and quantum dots having an inorganic coating exhibit significantly improved fluorescence and improved fluorescence half-life when compared to quantum dots having an organic coating. For example, in some embodiments, the fluorescence half-life of nanocrystals and quantum dots having an inorganic coating may be greater than 15,000 hours, greater than 20,000 hours, greater than 25,000 hours, greater than 30,000 hours, greater than 35,000 hours, or greater than 40,000 hours without significant loss of fluorescence. Therefore, nanocrystals and quantum dots having an inorganic coating may have a useful life of at least 30,000 hours to greater than 100,000 hours making these nanocrystals particularly for applications in which the particle longevity is important for light modules and LEDs such as those described above.

Nanocrystals and quantum dots having an inorganic coating useful in embodiments can be made of any suitable metal and non-metal atoms that are known to form semiconductor nanocrystals. For example, the semiconductor nanocrystals of various embodiments can be prepared from materials including, but are not limited to, Group 2-16, 12-16, 13-15 and 14 elements, and combining appropriate precursors can result semiconductor nanocrystals such as, but not limited to, ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, GaN, GaP, GaAs, GaSb, InP, InAs, InSb, AlAs, AlP, AlSb, PbS, PbSe, Ge and Si and binary, ternary and quaternary mixtures thereof, and the like.

In particular embodiments, the nanocrystals or quantum dots may be alloyed 2-6-6 SCNs having, for example, the formula $WY_xZ_{(1-x)}$, where W is a Group II element, Y and Z are different Group VI elements, and $0<X<1$. The term "2-6-6 SCN" represents a 3-element alloyed semiconductor with a Group II element-Group VI element-Group VI element composition. In some embodiments, the nanocrystals and quantum dots described herein may include Cd, Se, and S. Alloyed semiconductor nanocrystals are known in the art, for example, as described in U.S. Publication No. 2006/0028882, both of which are hereby incorporated by reference in its entirety. The term "alloyed" refers to two or more semiconductor materials forming a completely amalgamated solid wherein the two or more semiconductor materials are randomly distributed throughout the solid. In this respect, the term "alloy" refers to any solid, which is a product of an amalgamation process.

In particular embodiments, the semiconductor materials of alloyed nanocrystals and quantum dots may have a gradient of one or more of the semiconductor materials radiating from the center of the nanocrystal or quantum dot to the outermost surface of the nanocrystal. Such nanocrystals or quantum dots are referred to herein as "concentration-gradient quantum dots." For example, in some embodiments, a concentration-gradient quantum dot having at least a first semiconductor and a second semiconductor may be prepared such that the concentration of the first semiconductor gradually increases from the center of the concentration-gradient quantum dot to the surface of the quantum dot. In such embodiments, the concentration of the second semiconductor can gradually decrease from the core of the concentration-gradient quantum dot to the surface of the quantum dot. Without wishing to be bound by theory, concentration-gradient quantum dot may have a band gap energy that is non-linearly related to the molar ratio of the at least two semiconductors.

Concentration-gradient quantum dots may be prepared from any semiconductor material known in the art including those semiconductor materials listed above, and concentration-gradient quantum dots may be composed of two or more semiconductor materials. In particular embodiments, concentration-gradient quantum dots may be alloys of CdSeTe having a molecular formula $CdS_{1-x}Te_x$, CdSSe having a molecular formula $CdS_{1-x}Se_x$, CdSTe having a molecular formula $CdS_{1-x}Te_x$, ZnSeTe having a molecular formula $ZnSe_{1-x}Te_x$, ZnCdTe having a molecular formula $Zn_{1-x}Cd_xTe$, CdHgS having a molecular formula $Cd_{1-x}Hg_xS$, HgCdTe having a molecular formula HgCdTe, InGaAs having a molecular formula InGas, GaAlAs having a molecular formula GaAlAs, or InGaN having a molecular formula InGaN, where x in each example can be any fraction between 0 and 1.

In some embodiments, a core nanocrystal can be modified to enhance the efficiency and stability of its fluorescence emissions by coating a nanocrystal core with a semiconductor material to create a shell around the nanocrystal core thereby creating a core/shell nanocrystal, and in some embodiments, the nanocrystals may include more than one shell. The core/shell nanocrystals of such embodiments can have two or more distinct layers: a semiconductor or metallic core and one or more shells of an insulating or semiconductor material surrounding the core.

By "semiconductor shell" is meant a thin layer of semiconductor material (typically 1-10 atomic layers thick) deposited on the outer surface of a core nanocrystal. This "semiconductor shell" can be composed of the same material as the core or a different the semiconductor material than the core, and in some embodiments, at least one semiconductor material in the shell may be different than the semiconductor materials making up the core. The semiconductor shell should have a wider band gap than the core in order to efficiently protect the core electronically and sterically. The semiconductor shell can include any semiconductor material including, but not limited to, Cd, Zn, Ga, Pb, Mg, S, Se, Te, P, As, N, O, Sb, and combinations thereof, and in certain embodiments, the semiconductor shell may include ZnS, CdS, CdSe, CdTe, GaAs, or AlGaAs. The one or more shell layers may be prepared from a uniform dispersion of semiconductor materials or alloyed semiconductor materials having concentration gradients similar to those described for core nanocrystals.

Without wishing to be bound by theory, the addition of a shell may reduce the effect of surface defects on the semiconductor nanocrystal core which can result in traps, or holes, for electrons or other non-radiative energy loss mechanisms that degrade the electrical and optical properties of the core, and either dissipate the energy of an absorbed photon or at least affect the wavelength of the fluorescence emission slightly, resulting in broadening of the emission band. An insulating layer at the surface of the semiconductor nanocrystal core can provide an atomically abrupt jump in the chemical potential at the interface that eliminates energy states that can serve as traps for the electrons and holes resulting in a higher efficiency luminescence. It should be understood that the actual fluorescence wavelength for a particular semiconductor nanocrystal core may depend upon the size of the core as well as its composition. Thus, the emission wavelengths described above are merely approximations, and nanocrystal cores of the various compositions described above may actually emit at longer or shorter wavelengths depending upon their size.

The nanocrystals, quantum dots, and concentration-gradient nanocrystals useful in various embodiments can be of any size. For example, nanocrystals useful in embodiments may have a mean particle diameter (MPD) of form about 1 nm to about 100 nm, from about 1 to about 50 nm, and from about 1 to about 25 nm. More specific nanocrystals and quantum dots useful in embodiments can include, but are not limited to, those nanocrystals having an MPD of from about 0.5 nm to about 5 nm, about 1 nm to about 50 nm, about 2 nm to about 50 nm, about 1 nm to about 20 nm, about 2 nm to about 20 nm, or from about 2 to about 10 nm. For example, in particular embodiments, nanocrystals may have an MPD of, about 0.5 nm, about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 25 nm, about 30 nm, about 35 nm, about 40 nm, about 45 nm, about 50 nm, and the like and an MPD between any two values listed above. For a nanocrystal that is not substantially spherical, e.g., rod-shaped, the diameter at its smallest dimension may be from about 1 to about 100 nm, or from about 1 nm to about 50 nm or 1 nm to about 25 nm.

A typical single-color preparation of nanocrystals or quantum dots includes crystals that are preferably of substantially identical size and shape, and in some embodiments, the nanocrystals or quantum dots of embodiments can be roughly spherical. In other embodiments, the nanocrystals can be of any of numerous non-spherical shapes. For example, nanocrystals can be synthesized in a variety of shapes including, but not limited to, spheres, rods, discs, pyramid or pyramid like, nanorings, nanoshells, tetrapods, nanowires, and so on. Without wishing to be bound by theory, nanocrystals of different morphologies can have distinctive properties such as spatial distribution of the surface charge, orientation dependence of polarization of the incident light wave, and spatial extent of the electric field, and these distinctive properties may provide nanocrystals that are useful for particular purposes. In certain embodiments, the non-spherical nanocrystals may be useful based on their emission color.

It is well known that the color (emitted light) of the semiconductor nanocrystal can be "tuned" by varying the size and composition of the nanocrystal. Nanocrystals can absorb a wide spectrum of wavelengths, and emit a narrow wavelength of light. The excitation and emission wavelengths are typically different, and non-overlapping. The nanocrystals of a monodisperse population may be characterized in that they produce a fluorescence emission having a relatively narrow wavelength band. Examples of emission widths (full-width at half-maximum of the emission band, FWHM) useful in embodiments include less than about 200 nm, less than about 175 nm, less than about 150 nm, less than about 125 nm, less than about 100 nm, less than about 75 nm, less than about 60 nm, less than about 50 nm, less than about 40 nm, less than about 30 nm, less than about 20 nm, and less than about 10 nm. In particular embodiments, the FWHM can from about 20 nm to about 50 nm or from about 30 nm to about 35 nm.

The relationship between size and fluorescence wavelength of nanocrystals is well known, and in general, the nanocrystals of embodiments can be sized to provide fluorescence in the UV, visible, or infrared portions of the electromagnetic spectrum because this range is convenient for use in monitoring biological and biochemical events in relevant media. For example, in some embodiments, a CdSe nanocrystal having a diameter of about 3 nm may emit at a wavelength of about 525 nm, and in other embodiments, a ZnTe nanocrystal having a diameter of about 6 nm to about 8 nm may emit at a wavelength of about 525 nm. In still other embodiments, InP or InAs nanocrystals having a smaller diameter may emit at the same wavelength. In such embodiments, a ZnTe nanocrystal having generally larger diameters may have a larger absorption cross-section and produce brighter fluorescence. In other embodiments, a smaller nanocrystal may be necessary to, for example, achieve an appropriate hydrodynamic radius and maximize renal clearance for in vivo use, and the CdSe, InP, or InAs nanocrystals may be preferred.

Preparations of concentration-gradient quantum dots of various embodiments may similarly have substantially identical size and shape. However, unlike conventional quantum dots that are not alloyed and do not have a concentration gradient of semiconductor materials, varying the concentration of semiconductor materials and/or the extent of the concentration gradient can result in different populations of quantum dots of substantially the same size that fluoresce at different wavelengths thereby providing populations of quantum dots having substantially the same MPD that fluoresce at different colors. Thus, certain embodiments of the invention conversion layers including concentration-gradient quantum dots having substantially the same diameter and exhibiting different colors when excited.

In various embodiments, a significant proportion of the nanocrystals used in a particular application may be the same substantially size. For example, in some embodiments, at least about 60%, at least about 70%, at least about 80%, at least about 90%, at least about 95%, or about 100% of the nanocrystals can be substantially the same size. One of ordinary skill in the art will realize that particular sizes of nanocrystals, such as of semiconductor nanocrystals, are generally obtained as particle size distributions. The variance in diameter or size dispersity of populations of nanocrystal can be described as the root mean square ("rms"), where the smallest major axis may generally be used as the diameter for non-spherical particles. The root mean square of the nanocrystal populations used in embodiments can be less than about 30% rms, less than about 20% rms, or less than about 10% rms and in certain embodiments, less than about 9% rms, less than about 8% rms, less than about 7% rms, less than about 6% rms, less than about 5% rms, or a percentage between any two values listed. Such a collection of particles may sometimes referred to as being "monodisperse."

The quantum yield for the nanocrystals of various embodiments can be greater than about 10%, greater than about 20%, greater than about 30%, greater than about 40%, greater than about 50%, greater than about 60%, greater than about 70%, greater than about 80%, greater than about 90%, and ranges between any two of these values, and in particular embodiments, the quantum yield can be greater than about 30%, greater than about 50% or greater than about 70%. In some embodiments, a core nanocrystal can be less than about 10 nm in diameter, or less than about 7 nm in diameter, or less than about 5 nm in diameter.

In some embodiments, the emitted light can have a symmetrical emission of wavelengths. The emission maxima can be at any wavelength from about 200 nm to about 2,000 nm. Examples of emission maxima useful in embodiments can include, but are not limited to, about 200 nm, about 400 nm, about 600 nm, about 800 nm, about 1,000 nm, about 1,200 nm, about 1,400 nm, about 1,600 nm, about 1,800 nm, about 2,000 nm, and ranges between any two of these values. The fluorescence of a monodisperse population of nanocrystals can be characterized by the wavelength of light emitted when irradiated, and the emission maximum for a particular species of can be selected by the skilled artisan to provide a nanocrystals of any color. In various embodiments, the spectral range of a monodisperse population of nanocrystals encompassed by embodiments can be from about 370 nm to about 1200 nm, about 370 nm to about 900 nm, or from about 470 nm to about 800 nm, and in certain embodiments, nanocrystals, about 460 nm, about 525 nm, about 565 nm, about 585 nm, about 605 nm, about 625 nm, about 655 nm, about 705 nm, or about 800 nm.

Any inorganic materials may be used either alone or in combination to provide the inorganic coating of the nanocrystals and quantum dots of various embodiments. For example, in some embodiments, the inorganic coating may include silicon dioxide, silicon monoxide, silicon nitride, zirconium oxide, tantalum oxide, lanthanum oxide, cerium oxide, hafnium oxide, or a combination thereof, and in certain embodiments, the inorganic coating may include silicon dioxide. As discussed above, in embodiments, the inorganic coating may include substantially no organic components. However, in some embodiments, the inorganic coating may include less than about 30% organic components, less than 20%, less than 10%, less than 5%, or less than 1% organic components. The organic components may represent residual ligand used during synthesis of the nanocrystal or quantum dot. In some embodiments, organic components may be used to tailor the activity of the nanocrystal or quantum and may be intentionally included in the coating composition.

As discussed above, a passivation layer may formed on the outermost surface of the nanocrystal to provide a non-reactive layer on the surface of the nanocrystal to provide a tighter confinement of the quantum-mechanical wave functions so they do not extend beyond the surface of the passivation material. Thus, the quantum-mechanical bandgap of the passivation material should be of sufficient magnitude to prevent undesired interaction of the nanocrystal's desired wave functions with the ambient chemical environment. In addition, passivation may prevent chemical contamination of the nanocrystal further enhancing the stability of the passivation material.

In some embodiments, passivation may be enhanced by providing a secondary inorganic passivation material in addition to the inorganic coating material. Any passivation material known in the art may be used in this regard, and in certain embodiments, one or more secondary passivation materials may be present in one or more layers. Exemplary secondary passivation materials include, but are not limited to, aluminum, carbon, silicon, and combinations thereof. In certain embodiments, the secondary passivation material may be aluminum. Aluminum is a well-known oxygen scavenger and forms aluminum oxide ($Al_2O_3$), which provides a strong barrier to oxidation and other degradation processes. $Al_2O_3$ is also optically transparent and has a band gap for electrons and holes much greater than many of the semiconducting materials in the quantum dots themselves.

In some embodiments, nanocrystals or quantum dots having a concentration gradient 2-6-6 core, a first shell of a binary semiconductor material, a second shell of a binary semiconductor material, a tertiary semiconductor material, or combination thereof, and a passivation layer including inorganic materials may be incorporated into the conversion layer. For example, in some embodiments, the core may be a concentration-gradient CdSeS nanocrystal in which the gradient may be varied to produce nanocrystals the fluoresce in different colors, a first shell layer of CdS or ZnS, and a second shell layer of ZnS, ZnCdS, or a combination of ZnS and ZnCdS. The passivation layer may include aluminum oxide ($Al_2O_3$), an inorganic coating material such as fumed silica ($SiO_2$), or a combination of $Al_2O_3$ and $SiO_2$. In some embodiments, the first and second shell layers may be uniform, and in other embodiments, the first and second shell layers may be alloyed to produce concentration-gradient shell layers.

Further embodiments are directed to methods for preparing the nanocrystals and quantum dots having an inorganic coating. Such embodiments, generally, include the steps of forming a nanocrystal or quantum dot having an organic coating and replacing the organic coating with an inorganic coating material. The step of replacing may include the individual steps of removing or stripping the organic coating material from the outer surface of the nanocrystal or quantum dot, providing an inorganic coating material capable of binding to the outer surface of the nanocrystal, and binding the inorganic coating material to the outer surface of the nanocrystal or quantum dot. In some embodiments, methods for preparing nanocrystals and quantum dots having an inorganic coating may include the step of purifying the coated nanocrystal. The step of purifying may be carried out by any method. For example, in some embodiments, the nanocrystals can be purified by submersing the nanocrystals in a solvent solution and removing the nanocrystals from the solution. Any solvent may be used to purify the nanocrystals, and in certain embodiments, the solvent solution may be a one or more organic solvents.

Typically, quantum dots are synthesized and purified in coordinating organic molecules that are, generally, soap-like with a polar head and a non-polar tail region. The polar head binds to metal atoms on the surface of the quantum dots via electrostatic forces and the non-polar region provides solubility in solvents. This is adequate if quantum dots are to be used in solution. In some applications, it may be desirable to isolate quantum dots in dry form without solvents and without organic ligands or other components attached.

In certain embodiments, the solvent may act simultaneously as a solvent and a weak-binding ligand for quantum dots. For example, one solvent that meets these criteria is pyridine. Thus, embodiments, are directed to methods for preparing quantum dots using pyridine as the solvent. In addition to weakly-binding the quantum dots and providing a solvent for exchange of passivating ligance, pyridine forms an interpenetrating gel network with many inorganic compounds that may be used to form the inorganic coating such as, for example, fumed silica thereby stabilizing these coating materials.

In some embodiments, quantum dots may be prepared and isolated in the customary manner and, therefore, may include a coating of organic ligands. The organic ligands may be dissociated from the quantum dot and replaced with pyridine by, for example, combining the ligand coated nanoparticles with a sufficient amount of pyridine and heating this mixture. In other embodiments, pyridine may be the primary solvent in each step of the synthesis process. By such methods, quantum dots can be isolated in pure form in pyridine and/or suspended in pyridine to create a suspension of nanocrystals in pyridine.

After the quantum dots have been isolated and/or suspended in pure pyridine, the inorganic coating material may be added to the quantum dot/pyridine suspension at a weight ratio sufficient to coat the quantum dot with inorganic coating material. In particular embodiments, the inorganic coating may be fumed silica. Fumed silica consists of molecule-sized particles of amorphous silica ($SiO_2$) fused into branched, chainlike, three-dimensional secondary particles. These particles have a high density of oxygen atoms with available electrons for electrostatic binding to the surface of the quantum dots. The high density of oxygen atoms allows the fumed silica to dislodge the pyridine from the surface of the quantum dot allowing the fumed silica to bind directly to the outermost surface of the quantum dot.

Following exchange of the pyridine for fumed silica on the outermost surface of the nanocrystals. the pyridine can then be evaporated from the suspension leaving a dry powder consisting of quantum dots complexed with fumed silica. Thus, embodiments of the invention include a dry powder of quantum dots complexed with fumed silica. The quantum dot/fumed silica complex include less than about 30% organic components, less than 20%, less than 10%, less than 5%, or less than 1% organic components, and in particular embodiments, the quantum dot/fumed silica complex may include an inorganic coating having substantially no organic components. Moreover, the quantum dot/fumed silica complex is stable and exhibits persistent fluorescence outside of solution and in the absence of organic ligands and organic solvents.

The precursors used in the preparation of the nanocrystals and quantum dots of various embodiments may be prepared from any known precursors. In particular, suitable core and shell precursors useful for preparing semiconductor cores are known in the art and can include group 2 elements, group 12 elements, group 13 elements, group 14 elements, group 15 elements, group 16 elements, and salt forms thereof. For example, a first precursor may include metal salt ($M^+X^-$) including a metal atom ($M^+$) such as, for example, Zn, Cd, Hg, Mg, Ca, Sr, Ba, Ga, Al, Pb, Ge, Si, or in salts and a counter ion ($X^-$), or organometallic species such as, for example, dialkyl metal complexes. In such embodiments, first precursors can include zinc salts, such as zinc carboxylate salts, including zinc acetate, zinc oleate, and zinc stearate, and the like, as well as zinc chloride, and organometallic precursors, such as diethyl zinc, and mixtures thereof. In other embodiments, suitable a first precursor can include zinc phosphonates, zinc phosphinic acids, cadmium phosphonates, cadmium phosphinic acids, and mixtures thereof. In still other embodiments, a first precursor can include cadmium salts, such as cadmium carboxylate salts, including cadmium acetate, cadmium oleate, and cadmium stearate, and the like, as well as cadmium nitrate, cadmium oxide, and organometallic precursors, such as dimethyl cadmium, and mixtures thereof.

A second precursor may include a non-metal atom, which may be provided as an ionic or neutral non-metal species. In some embodiments, a second precursor may include one or more of elemental sulfur, elemental phosphorous, elemental selenium, or elemental tellurium precursors, or in other embodiments, a second precursor may include one or more complexes of, for example, sulfur, selenium, or tellurium with chalcogen sources such as TOP to produce TOPS, TOPSe or TOPTe, or bis(trimethylsilyl) to produce $TMS_2S$, $TMS_2Se$, $TMS_3P$, $TMS_3AS$, or $TMS_2Te$. In still other embodiments, second precursors can include, but are not limited to, oleylamine sulfide, oleylamine selenide, oleylamine telluride, decylamine sulfide, decylamine selenide, decylamine telluride, octadecene sulfide, octadecene selenide, octadecene telluride, and mixtures thereof. The selection of suitable precursors for the preparation of various core and core/shell nanocrystals is within the purview of those of ordinary skill in the art.

Formation of the shell may be carried out by any method. For example, in some embodiments, a core/shell nanocrystal may be prepared by providing one or more additional semiconductor precursors such as the first core precursor or second core precursors described above, which can be different than the precursors used to form the core, following core preparation, and in certain embodiments, additional solvents, multi-functional ligands, and/or reaction promoters may be provided. In some embodiments, the method may include the step of heating the mixture, and as a result of heating, the additional precursors may precipitate on the surface of the core and provide a shell layer, i.e., a semiconductor or insulator layer over the core. In other embodiments, the additional nanocrystal precursors, solvents, multi-functional ligands, and/or reaction promoters may be added to a heated mixture that contains preformed cores to initiate formation of the shell.

The solvent used in various embodiments may vary. For example, suitable solvents can include, but are not limited to, hydrocarbons, amines, phosphines, carboxylic acids, phosphine oxides, alkylphosphonic acids, and mixtures thereof, and in more specific embodiments, solvents include, octadecene, TOPO, TOP, decylamine, octadecane, dioctylamine, tributylphosphine, oleylamine, oleic acid, and mixtures thereof. In certain embodiments, the core or shell precursor may be in a solution with octadecene, TOPO, or TOP as the solvent.

In various embodiments, the reaction mixture may be heated to a temperature sufficient to form of a core or core/shell nanocrystal, and the step of heating can be carried out for any period of time. For example, in some embodiments, the temperature can be from about 200° C. to about 350° C. However, higher or lower temperatures may be appropriate for a particular reaction involving specific precursors and/or multi-functional ligands. The time period may additionally vary based on the precursors and/or multi-functional surface ligands used and in some embodiments, may be from about 30 minutes to about 48 hours. In other embodiments, the time period for heating may be up to about 5 hours, up to about 6 hours, or up to about 12 hours, and in still other embodiments, the time period may be from about 15 minutes to about 4 hours, or from about 30 minutes to about 2 hours. Of course, the time periods of embodiments include any time between the time periods provided above; thus, the time period of various embodiments may be for example, about 45 minutes, or about 1, 1.25, 1.5, 1.75, 2, 2.25, 2.5, 2.75, 3, 3.25, 3.5, 3.75, or 4 hours and so on.

In certain embodiments, the solution or mixture prepared as above can further include, for example, a reaction promoter and additional solvents and/or ligands. For example, a reaction promoter can be added to adjust the oxidation state of one or both of the precursors if the oxidation states of the two precursors would need to be adjusted for reaction to occur. Thus, in some embodiments, nanocrystals prepared according to the methods of this disclosure may have portions of the surface covered by multi-functional ligands described above and other portions of the surface covered by other ligands such as trialkylphosphines, trialkylphosphine oxides, trialkylamines, alkyl carboxylates, and alkyl phosphonic acids.

Although the present invention has been described in considerable detail with reference to certain preferred embodiments thereof, other versions are possible. Therefore the spirit and scope of the appended claims should not be limited to the description and the preferred versions contained within this specification. Various aspects of the present invention will be illustrated with reference to the following non-limiting examples.

What is claimed is:

1. A light module comprising:
   a first substrate;
   a conversion layer adjacent to the first substrate and contacting the first substrate, the conversion layer comprising a plurality of quantum dots/nanocrystals dispersed throughout a matrix material, each quantum dot/nanocrystal having an inorganic outer coating, selected from silicon monoxide, silicon nitride, or a combination thereof, covering the outermost surface of the quantum dot/nanocrystal; and
   a second substrate adjacent to the conversion layer and contacting the conversion layer on a surface opposite the surface contacting the first substrate.

2. The light module of claim 1, wherein matrix material comprises a polymer matrix in which the at least one quantum dot/nanocrystal is embedded.

3. The light module of claim 1, wherein the conversion layer further comprises at least one scattering particle.

4. The light module of claim 1, wherein at least one of the conversion layer, first substrate layer, or second substrate layer is textured, patterned, coated, chemically modified, or combinations thereof.

5. The light module of claim 1, further comprising an intermediate layer comprising a diffusing layer positioned and arranged to increase the path length of light entering the conversion layer.

6. The light module of claim 5, wherein the diffusion layer comprises a photonic crystal film.

7. The light module of claim 5, wherein diffusion layer is patterned.

8. The light module of claim 7, wherein the diffusion layer has a hexagonal waffle pattern.

9. The light module of claim 1, further comprising one or more reflective layers positioned and arranged to reflect light of a wavelength corresponding to the wavelength emitted by the conversion layer away from a light source.

10. The light module of claim 1, further comprising a light source.

11. The light module of claim 10, wherein the light source produces blue light.

12. The light module of claim 1, wherein the plurality of quantum dots/nanocrystals comprises two or more species of quantum dots/nanocrystals capable of emitting light at different wavelengths.

13. The light module of claim 12, wherein the two or more species of quantum dots/nanocrystals are arranged randomly.

14. The light module of claim 12, wherein the two or more species of quantum dots/nanocrystals are arranged in groups of quantum dots/nanocrystals emitting light of the same wavelength.

15. The light module of claim 14, wherein the groups of quantum dots/nanocrystals are arranged in geometric patterns selected from rows, blocks, squares, circles, ovals, or combinations thereof.

16. An optoelectric device comprising:
a light source capable of producing light having an input wavelength; a light module comprising:
a first substrate;
a conversion layer adjacent to the first substrate and contacting the first substrate, the conversion layer comprising plurality of quantum dots/nanocrystals, each having an inorganic outer coating covering the outermost surface of the quantum dot/nanocrystal, dispersed within a matrix material and being capable of converting the input wavelength to one or more different wavelengths of outgoing light;
wherein said inorganic outer coating is selected from silicon monoxide, silicon nitride, or a combination thereof and
a second substrate adjacent to the conversion layer and contacting the conversion layer on a surface opposite the surface contacting the first substrate.

17. The optoelectric device of claim 16, wherein the source of light waves is selected from an light emitting diode (LED), incandescent bulb, fluorescent bulb, laser, electroluminescent, or combination thereof.

18. The optoelectric device of claim 16, wherein the optoelectric device is a solid state light source.

19. The optoelectric device of claim 16, wherein the plurality of quantum dots/nanocrystals comprises two or more species of quantum dots/nanocrystals capable of emitting light at different wavelengths.

20. The optoelectric device of claim 16, further comprising a second light module having a conversion layer comprising plurality of quantum dots/nanocrystals dispersed within a matrix material and being capable of converting the input wavelength to a wavelength of outgoing light other than the one or more wavelengths of outgoing light converted by the light module.

21. The optoelectric device of claim 20, wherein the light module converts input light to red output light and the second light module converts input light to green output light.

* * * * *